United States Patent [19]

Machida et al.

[11] Patent Number: 4,943,965
[45] Date of Patent: Jul. 24, 1990

[54] DIGITAL SIGNAL DECODING METHOD AND CIRCUIT THEREFOR

[75] Inventors: Hirohisa Machida; Takeo Nakabayashi, both of Itami, Japan

[73] Assignee: Mitsubishi Denki Kabushiki Kaisha, Tokyo, Japan

[21] Appl. No.: 217,585

[22] Filed: Jul. 11, 1988

[30] Foreign Application Priority Data

Dec. 22, 1987 [JP] Japan .................. 62-324408

[51] Int. Cl.$^5$ .............................. G06F 11/16
[52] U.S. Cl. ......................... 371/36; 371/6; 371/55
[58] Field of Search ............... 371/6, 36, 55, 57, 57.1, 371/57.2; 375/25, 34; 370/89

[56] References Cited

U.S. PATENT DOCUMENTS

| | | | |
|---|---|---|---|
| 3,449,716 | 6/1969 | Brothman | 371/6 |
| 4,617,475 | 10/1986 | Reinschmidt | 371/36 |
| 4,670,880 | 6/1987 | Jitsutawa | 371/36 |
| 4,686,676 | 8/1987 | McPherson | 371/36 |
| 4,709,376 | 11/1987 | Kagi | 371/36 |
| 4,771,427 | 9/1988 | Tulpule | 371/36 |
| 4,809,274 | 2/1989 | Walker | 371/36 |
| 4,811,361 | 3/1987 | Bacou | 371/55 |

OTHER PUBLICATIONS

"Key Point of Error Correction Encoding Technique", Japanese Industrial Technology Center (3/20/86).

Primary Examiner—Michael R. Fleming
Attorney, Agent, or Firm—Townsend and Townsend

[57] ABSTRACT

A digital signal decoding method and a circuit therefor which, when each data of first and second 1-bit of a set of 3-bit data received is a logical "1", decodes the data to 1-bit data of "1". When each of the data of the first and second 1-bit is "0", decodes the data to 1-bit data of "0". And when first and second 1-bit data is a combination of "1" and "0", directly decodes a third bit, thereby enabling a quick decoding result to be obtained when receiving the data.

7 Claims, 4 Drawing Sheets

DIGITAL SIGNAL DECODING METHOD AND CIRCUIT THEREFOR

BACKGROUND OF THE INVENTION

1. Field of the Invention

The present invention relates to a decoding circuit widely used for example, in a data communication apparatus. More particularly, the invention relates to a method for decoding original data at the receiving side which is encoded differently from the original data for error correction. In addition to the decoding method, a circuit for carrying out the method is provided.

2. Description of the Prior Art

FIG. 1 is a typical block diagram of a general communication system for data communication.

In FIG. 1, reference numeral 55 designates a signal line connected to an encoder 51 for transmitting data.

When one-bit data to be transmitted is input from the signal line 55, is in the form of a logical "1", and encoder 51 encodes the data to 3-bit data of logical "111." When the same is a logical "0", 3-bit data of logical "000" is encoded and output to a transmitter 52.

The transmitter 52 outputs to a channel 56 the signal by 3-bit unit received from the encoder 51.

Reference numeral 53 designates a receiver, which receives the signal transmitted through the channel 56 and inputs it to a decoder 54.

When 2-bits of the 3-bits of the data from the receiver 53 is a logical "1", the decoder 54 outputs 1-bit data of logical "0" to a signal line 7. When 2-bits are logical "1", 1-bit data of logical "0" is output to the same.

Such constitution is described in "Key Point of Error Correction Encoding Technique" (Mar. 20, 1986) published by Japanese Industrial Technology Center, which is effective to correct an error generated in the channel 56.

The above method converts the 1-bit data into 3-bits and transmits it. At the receiver side the 3-bit data is compared and decoded into 1-bit data and output. A problem is created in that it takes a relatively long processing time to decode the data.

SUMMARY OF THE INVENTION

In the light of such circumstances, the present invention has been designed. An object thereof is to provide a decoding method for digital signals, which is capable of reducing a processing time necessary for decoding to the level in actual time, and a circuit for the decoding method.

The decoding method for the digital signal and the circuit therefor of the invention, when each first and second 1-bit data of the received data of one set of 3-bits are logical "1", decodes the data to 1-bit data of logical "1". When each first and second each 1-bit data are logical "0", the data is decoded to 1-bit data of logical "0". When each first and second 1-bit data are in combination of logical "1" and "0", the data is decoded to a third bit as it is.

The above and further objects and features of the invention will be more fully apparent from the following detailed description with accompanying drawings.

DESCRIPTION OF THE PREFERRED EMBODIMENTS

Next, explanation will be given on the principle of the invention.

Figure 1:
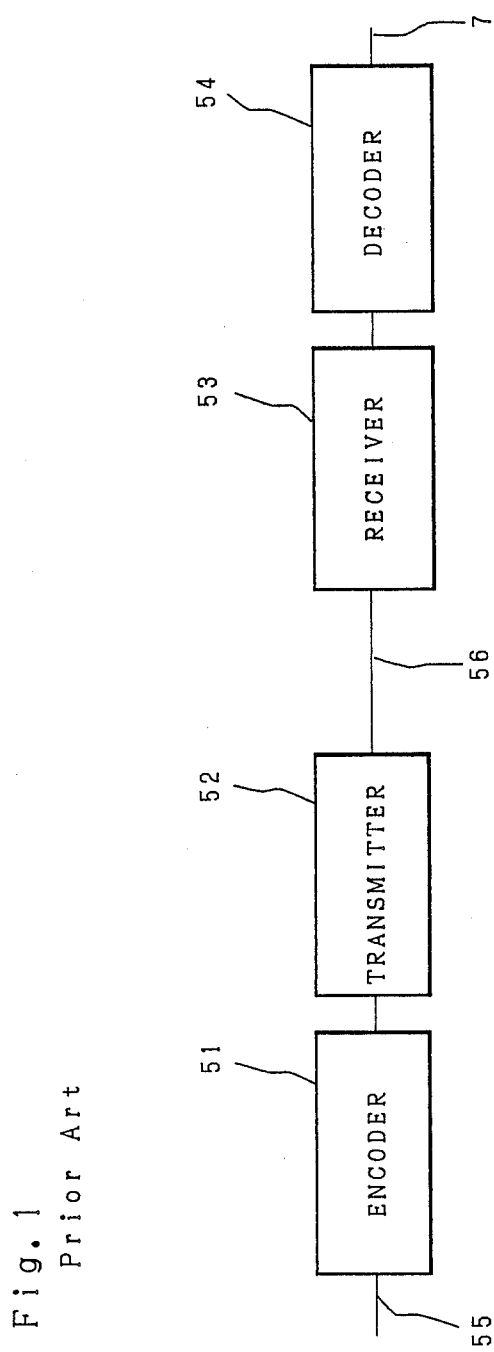
FIG. 1 is a schematic block diagram of the conventional communication system.
Figure 2:
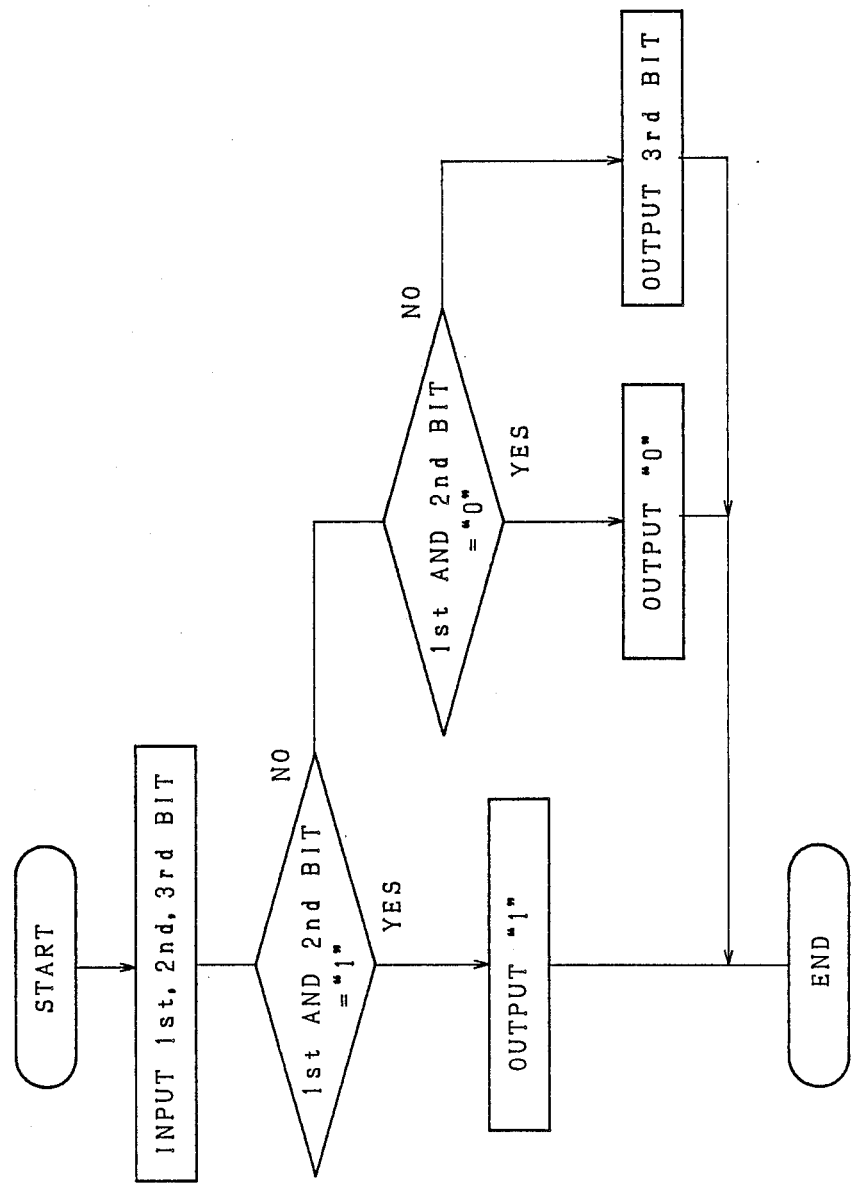
FIG. 2 is a flow chart explanatory of the procedure of the decoding method of the invention.

FIG. 2 is a flow chart of the procedure of the decoding method for a digital signal of the invention.

Data in which 1-bit digital data of logical "1" is converted into 3-bit digital data of logical "111" and the same of logical "0" is converted into the 3-bit digital data of logical "000". When this data is input first and second bit values among the data are detected, so that, when both the values are logical "1", a logical "1" is output as the data of the decoding result.

When both the first and second bit values are detected to be logical "0", a logical "0" is output as the decoding result.

Also, when the first and second bits are a combination of logical "1" and "0", that is, the first bit is a logical "1" and the second bit "0", or the former is "0" and the latter is "1", the third bit value is output as it is as the data of the decoding result.

Consequently, the received 3-bit data, when 2-bits or 3-bits thereof are logical "1", is decoded to 1-bit data of logical "1", and when 2-bits or 3-bits are logical "0", is decoded to logical "0" respectively.

Next, an embodiment of the digital signal decoding method and the circuit therefor of the invention will be detailed with reference to the drawing.

Figure 3:
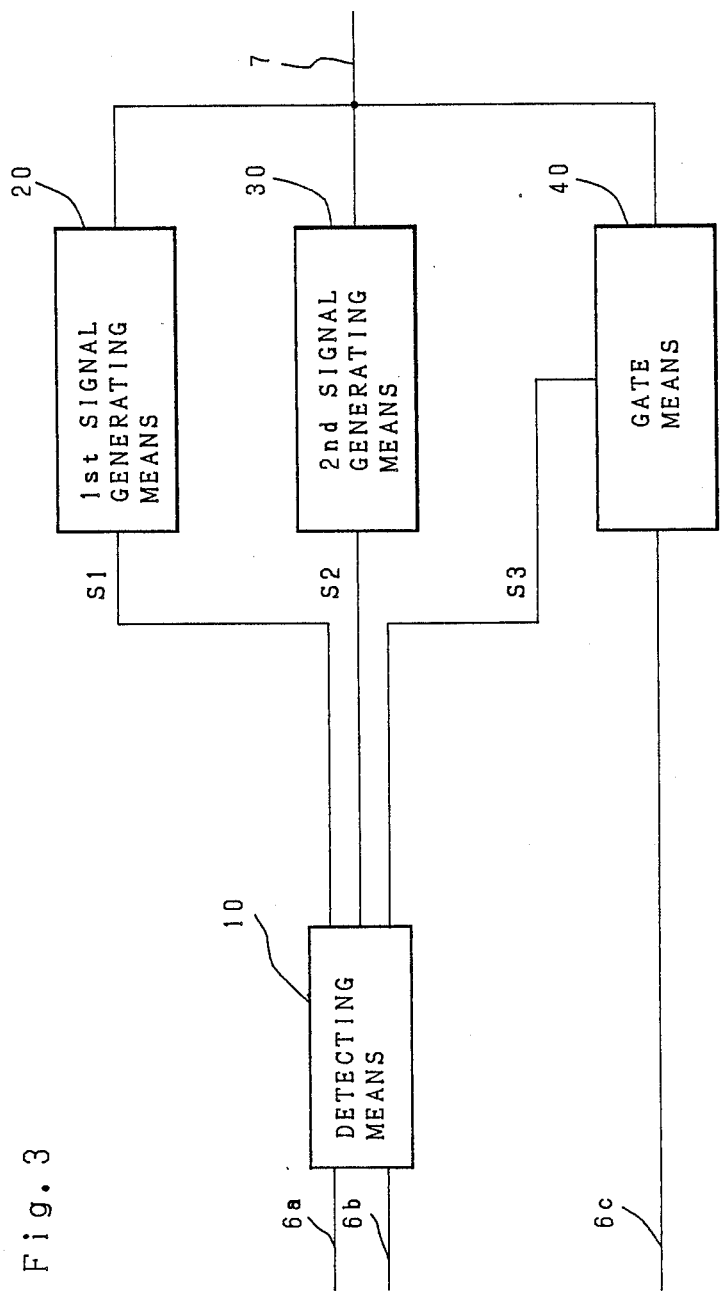
FIG. 3 is a block diagram showing a circuit structure for executing the decoding method of the invention.

FIG. 3 is a block diagram of the digital signal decoding circuit of the invention for executing the decoding method of the invention of the aforesaid procedure.

In FIG. 3, reference numerals 6a, 6b and 6c designate first, second and third signal lines respectively.

First, second and third bits of data of 3-bits in the unit received by a receiver (not shown) are transmitted through the signal lines.

Reference numeral 7 designates a fourth signal line through which the data decoded by the circuit of the invention is output.

The first and second signal lines 6a and 6b are connected to a detection means 10, the third signal line 6c being connected to a gate means 40.

The detection means 10 detects whether input signals on the signal lines 6a and 6b are both logical "1" or "0" or different values in combination of "1" and "0". When both are logical "1", a first detection signal S1 is output to a first signal generating means 20, when both are logical "0", a second detection signal S2 is output to a second signal generating means 30, and when both are of different value, a third detection signal S3 is output to the gate means 40.

When first signal generating means 20 receives the first detection signal S1 it, outputs the signal "1" to the fourth signal line 7. When the second signal general means 30 receives the second detection signal S2, it outputs the signal "0" to the fourth signal line 7 Finally, when gate means 40 receives the third detection signal S3, it outputs to the fourth signal line 7 the input signal on the third signal line 6c.

Accordingly, when both 2-bits of the received 3-bits are logical "1", a signal "1" is output from the fourth signal line 7. When both 2-bits of the same are logical "0", the signal "1" is output from the fourth signal line 7.

Figure 4:
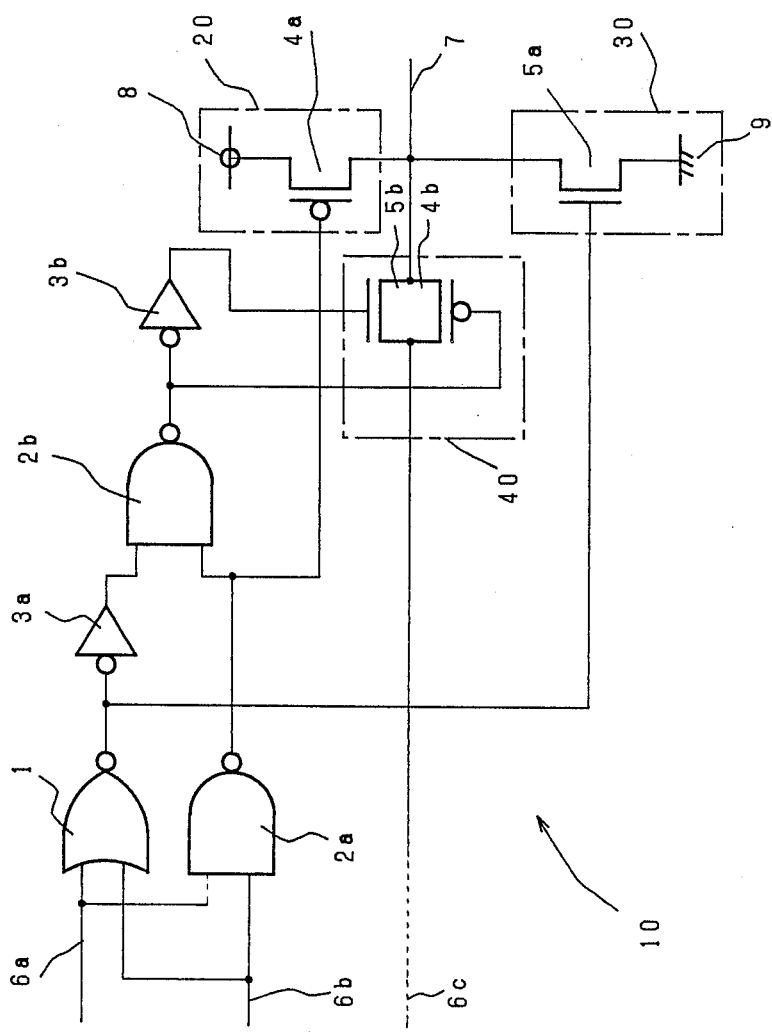
FIG. 4 is a circuit diagram showing in detail the structure of the invention.

FIG. 4 is a circuit diagram showing a further detailed structure of the digital signal decoding circuit of the invention, in accordance with the present invention.

In FIG. 4, reference numerals 6a, 6b and 6c designate the first, second and third signal lines, through which the first, second and third bits of the data of 3-bits in unit received by the receiver (not shown) are transmitted respectively.

Reference numeral 7 designates a fourth signal line through which the resultant data decoded by the circuit of the invention is output.

Next, reference numeral 1 designates a 2-input NOR gate to which the first and second signal lines 6a and 6b are input. The output of NOR gate 1 is given to the input of a first inverter 3a and to the gate of a first n-type gate element (a switching transistor, such as a FET) 5a respectively.

The first n-type gate element 5a receives, at the gate thereof, the output of NOR gate 1. Connected at the drain of gate element 5a is the fourth signal line 7 and at the source is earth potential 9 of "0" level.

The output of the first inverter 3a, in other words, an inverted signal of the output of the NOR gate 1, is transmitted to one input of two inputs of a second NAND gate 2b.

Reference numeral 2a designates a first NAND gate to which the first signal line 6a and second signal line 6b are input. The output of the first NAND gate 2a is transmitted to the input of the second NAND gate 2b and to the gate of a first p-type gate element (a switching transistor, such as a FET) 4a.

The first p-type gate element 4a receives at the gate thereof, the output of the first NAND gate 2a. Connected at the drain of gate 2a is power supply potential 8 of "1" level and at the source is the fourth signal line 7.

The second NAND gate 2b receives the outputs of the first inverter 3a and of the first NAND gate 2a, and delivers its output to the input of the second inverter 3b and gate of a second p-type gate element (a switching transistor, such as a FET) 4b.

The output of the second inverter 3b, in other words, the inverted signal of the output of the second NAND gate 2b, is transmitted to the gate of a second n-type gate element (a switching transistor, such a FET) 5b.

The second p-type gate element 4b receives, at the gate thereof the output of the second NAND gate 2b. Connected at the drain of gate element 4b is the third signal line 6c and at the source is the fourth signal line 7.

The second n-type gate element 5b receives at the gate thereof, the output of the second inverter 3b. Connected at the drain of gate element 5b is the third signal line 6c and at the source is the fourth signal line 7.

In addition, when the detailed circuit diagram FIG. 4 is compared with the block diagram FIG. 3, the first signal generating means 20 comprises the first p-type gate element 4a and power supply potential 8. The second signal generating means 30 comprises the first n-type gate element 5a and earth potential 9. The gate means 40 comprises the second p-type gate element 4b and second n-type gate element 5b. And the detection means 10 comprises the NOR gate 1, first NAND gate 2a, second NAND gate 2b, first inverter 3a and second inverter 3b.

The circuit of the invention constructed as abovementioned operates as follows:

When both the first signal line 6a and the second signal line 6b receive the signal "1", the output of the first NAND gate 2a goes to a logical "0". Hence, the gate of first p-type gate element 4a receives the signal "0", whereby the first p-type gate element 4a is conductive and the fourth signal line 7 is connected to power supply potential 8.

At this time, since the output of the NOR gate 1 also goes to a logical "0" and the signal "0" is introduced to the gate of the first n-type gate element 5a, the first n-type gate element 5a is not conductive. One input of the second NAND gate 2b receives the output signal "0" of the first NAND gate 2a, whereby the output of the second NAND gate 2b goes to a logical "1." This signal "1" is transmitted to the gate of the second p-type gate element 4b. Also, the signal "0", inverted by the second inverter 3b, is transmitted to the gate of second n-type gate element 5b. Hence, the second p-type gate element 4b and the second n-type gate element 5b are not conductive.

Accordingly, in a case where the signal "1" is input to both the first signal line 6a and second signal line 6b, only the first p-type gate element 4a is conductive, whereby the fourth signal line 7 outputs the signal of "1" (power supply potential 8).

On the other hand, in a case where the signal "0" is input to the first signal line 6a and second signal line 6b, the output of the NOR gate 1 goes to a logical "1". Hence, since the gate of the first n-type gate element 5a receives the signal "1", the first n-type gate element 5a is conductive and the fourth signal line 7 is connected to the earth potential 9.

At this time, the output of the first NAND gate 2a goes to a logical "1" and the first p-type gate element 4a also receives the signal "1", whereby the first p-type gate element 4a is not conductive. Also, since one input of the second NAND gate 2b receives the output of "1" of the first NAND gate 2a, the output of the gate 2b goes to a logical "1" and the signal "1" is given to the gate of the second p-type gate element 4b. The signal of "0", inverted by the second inverter 3b, is transmitted to the gate of the second n-type gate element 5b, whereby both the second p-type gate element 4b and the second n-type gate element 5b are not conductive.

Accordingly, when both the first signal line 6a and the second signal line 6b receive the signal "0", only the first n-type gate element 5a is conductive, whereby the fourth signal line 7 outputs a signal of "0" (earth potential 9).

Furthermore, in a case where the signal "1" is input to the first signal line 6a and that of "0" to the second signal line 6b, the output of the NOR gate 1 goes to a logical "0" and the output of the first inverter 3a goes to a logical "1". Also, since the output of the first NAND gate 2a goes to a logical "1", the output of the second NAND gate 2b goes to a logical "0". This "0" is transmitted to the gate of the second p-type gate element 4b, whereby the third signal line 6c is connected to the fourth signal line 7.

At this time, since the output of NOR gate 1 goes to a logical "0", the first n-type gate element 5a is not conductive, and since the output of the first NAND gate 2a goes to a logical "1", the first p-type gate element 4a is not conductive.

In addition, since the output of "0" of the second NAND gate 2b is inverted by the second inverter 3b, the signal "1" is transmitted to the gate of second n-type gate element 5b, whereby the second n-type gate element 5b is conductive.

Accordingly, when the signal "1" is input to the first signal line 6a and the signal "0" is input to the second signal line 6b, the second p-type gate element 4b is conductive, whereby the fourth signal line 7 directly outputs the input signal to the third signal line 6c.

On the contrary, in a case where the signal "0" is input to the first signal line 6a and the signal "1" is input to the second signal line 6b, the output of NOR gate 1 goes to a logical "0" and the output of the first inverter 3a goes to a logical "1". Since the output of the first NAND gate 2a goes to a logical "1", the output of the second NAND gate 2b goes to a logical "0". This "0" signal is inverted by the second inverter 3b to go to a logical "1" and transmitted to the gate of the second n-type gate element 5b, whereby the third signal line 6c is connected to the fourth signal line 7.

At this time, since the output of NOR gate 1 goes to a logical "0", the first n-type gate element 5a is not conductive. Since the output of the first NAND gate 2a goes to a logical "1", the first p-type gate element 4a is not conductive. In addition, since the output "0" of the second NAND gate 2b is given to the gate of the second p-type gate element 4b, the second n-type gate element 5b is conductive.

Accordingly, when the signal of "0" is input to the first signal line 6a and the signal "1" is input to the second signal line 6b, the second n-type gate element 5b is conductive, whereby the input signal to the third signal line 6c is directly output on the fourth signal line 7.

In addition, in the above-mentioned embodiment, when the input signal of the first and second signal lines 6a and 6b are in combination of "1" and "0", both the second p-type gate element 4b and second n-type gate element 5b are conductive. The reason for this is that the n-type gate element (5b in the present embodiment) is lower in transmission efficiency of the high-level signal and conversely, the p-type gate element (4b in the present embodiment) is lower in transmission efficiency of the low-level signal, so that both the elements are used to ensure transmission.

As seen from the above, the data of 3-bits in unit, at the earliest, can be output as the decoded data at the point of time when the data of 2-bits is input. Further, the data of the 3rd bit at the latest can be output as it is the decoded result, thereby reducing a time required for decoding the received data.

This invention may be embodied in several forms without departing from the spirit of essential characteristics thereof. The present embodiment is therefore illustrative and not restrictive, since the scope of the invention is defined by the appended claims rather than by the description preceding them. All changes that fall within the meets and bounds of the claims, or equivalence of such meets and bounds thereof are therefore intended to be embraced by the claims.

What is claimed is:

1. A method for decoding an encoded 3-bit digital data signal to a 1-bit digital data signal, comprising the steps of:
   receiving the encoded 3-bit digital data signal from an external source;
   determining whether a first bit of the 3-bit digital data signal is a logical "1";
   determining whether a second bit of the 3-bit digital data signal is a logical "1";
   setting the 1-bit digital data signal to a "1" if said first bit and said second bit are both a logical "1";
   setting the 1-bit digital data signal to a "0" if said first bit and said second bit are both a logical "0";
   decoding a third bit of the 3-bit digital data signal directly if said first bit and said second bit are not both a logical "1" or a logical "0"; and
   transmitting the 1-bit digital data signal to an external destination.

2. A digital data signal decoding circuit in which individual bits of a 3-bit digital data signal are input to first, second, and third signal lines wherein the 3-bit digital data signal is decoded into a 1-bit digital data signal and output on a fourth signal line, comprising:
   detection means for detecting a logical value of the individual bits of the 3-bit digital data signal input on the first and second signal lines and for outputting a first detection signal if the first and second signal lines are both a logical "1", for outputting a second detection signal if the first and second signal lines are both a logical "0", and for outputting a third detection signal if the first and second signal lines are a combination of a logical "1" and a logical "0";
   first signal generating means for receiving said first detection signal from said detection means and generating a logical "1" in response to said first detection signal to be output on the fourth signal line;
   second signal generating means for receiving said second detection signal from said detection means and generating a logical "0" in response to said second detection signal to be output on the fourth signal line; and
   gate means connected to receive said third detection signal for receiving an input signal on the third signal line and providing said input signal on the fourth signal line in response to receiving said third detection signal.

3. The digital data signal decoding circuit of claim 2 wherein said detection means further comprises:
   a NOR gate having a first input connected to said first signal line, a second input connected to said second signal line, and an output for providing said second detection signal to said second signal generating means;
   a first NAND gate having a first input connected to said first signal line, a second input connected to said second signal line, and an output for providing said first detection signal to said first signal generating means;
   a first inverter having an input connected to said output of said NOR gate and an output;
   a second NAND gate having a first input connected to said output of said first inverter, a second input connected to said output of said first NAND gate, and an output connected to said gate means for providing said third detection signal to said gate means; and
   a second inverter having an input connected to said output of said second NAND gate and an output connected to said gate means for providing an inverted version of said third detection signal to said gate means.

4. The digital data signal decoding circuit of claim 2 wherein said first signal generating means further comprises:
- a first p-type gate element having a drain connected to an active signal, a source connected to the fourth signal line, and a gate connected to said detection means for receiving said first detection signal.

5. The digital data signal decoding circuit of claim 2 wherein said second signal generating means further comprises:
- a first n-type gate element having a drain connected to the fourth signal line, a source connected to ground, and a gate connected to said detection means for receiving said second detection signal.

6. The digital data signal decoding circuit of claim 2 wherein said gate means further comprises:
- a second n-type gate element having a drain connected to the third signal line, a source connected to the fourth signal line, and a gate connected to said detection means for receiving said third detection signal; and
- a second p-type gate element having a drain connected to the third signal line, a source connected to the fourth signal line, and a gate connected to said detection means for receiving an inverted version of said third detection signal.

7. The digital data signal decoding circuit of claim 2 wherein said detecting means, said first signal generating means, said second signal generating means, and said gate means are situated on one chip.

* * * * *